US006520267B2

(12) United States Patent
Fünfer et al.

(10) Patent No.: US 6,520,267 B2
(45) Date of Patent: Feb. 18, 2003

(54) ROTARY SWITCH FOR A HAND-HELD POWER TOOL AND A SWITCHING DEVICE INCLUDING THE ROTARY SWITCH

(75) Inventors: Josef Fünfer, Königsbrunn (DE); Michael Bohuschke, Munich (DE); Claus Gilger, Munich (DE)

(73) Assignee: Hilti Aktiengesellschaft, Schaan (LI)

( * ) Notice: Subject to any disclaimer, the term of this patent is extended or adjusted under 35 U.S.C. 154(b) by 23 days.

(21) Appl. No.: 09/891,044

(22) Filed: Jun. 25, 2001

(65) Prior Publication Data

US 2002/0014343 A1 Feb. 7, 2002

(30) Foreign Application Priority Data

Jun. 26, 2000 (DE) ........................................ 100 31 050

(51) Int. Cl.[7] ............................ E02D 7/02; B27C 3/08; B23B 45/00; H10H 19/00

(52) U.S. Cl. .......................... 173/48; 173/170; 200/336

(58) Field of Search ................. 173/48, 170; 200/68 A, 200/564, 565, 567, 293.1, 336, 332.2, 17 R; 310/50, 83, 67

(56) References Cited

U.S. PATENT DOCUMENTS

| | | | | | |
|---|---|---|---|---|---|
| 3,781,499 | A | * | 12/1973 | Reichert et al. | 200/336 |
| 4,506,743 | A | * | 3/1985 | Grossmann | 173/48 |
| 4,843,196 | A | * | 6/1989 | Bissig et al. | 200/336 |
| 5,056,607 | A | * | 10/1991 | Sanders | 173/48 |
| 5,159,986 | A | * | 11/1992 | Hoser | 173/48 |
| 6,109,364 | A | * | 8/2000 | Demuth et al. | 173/48 |
| 6,192,996 | B1 | * | 2/2001 | Sakaguchi et al. | 173/48 |

* cited by examiner

*Primary Examiner*—Anthony D. Stashick
(74) *Attorney, Agent, or Firm*—Sidley Austin Brown & Wood, LLP

(57) ABSTRACT

A rotary switch for a hand-held tool and including a manually operated actuation member (3) rotatable over a predetermined angle (ϕ) for switching from one operational mode to another immediately adjacent operational mode, a rotatable switching member (6) arranged coaxially with the actuation member (3), an overhanging spring (5) connected with the switching member (6) for joint rotation therewith, and an operating pin (4) connected with the actuation member (3) and arranged eccentrically with respect to its rotational axis for deflecting an arm of the overhanging spring to thereby rotate the switching member (6) over a predetermined angle to provide for a predetermined displacement of the switching element (12) of the hand-held tool.

10 Claims, 2 Drawing Sheets

ROTARY SWITCH FOR A HAND-HELD POWER TOOL AND A SWITCHING DEVICE INCLUDING THE ROTARY SWITCH

BACKGROUND OF THE INVENTION

1. Field of the Invention

The present invention relates to a rotary switch and a switching device including such a rotary switch for a hand-held power tool such as a combination hammer drill for producing at least partially rotatable movement of a working tool.

2. Description of the Prior Art

A combination hammer drill includes generally drive means for producing both rotational and percussion movements, which permits switching between different operational modes such as drilling, drilling and chiseling, chisel positioning, and pure chiseling. The switching is effected manually with a mode selection switch which is connected with the hand-held power tool drive. An inadvertent switching from, e.g., a chiseling operational mode, when in accordance with the operational mode, a non-rotatable working tool is used, to a drilling operational mode or a drilling and chiseling operational mode can present a danger for the user.

Generally, the selection of an operational mode is effected with switching sleeves located within the hand-held power tool. The switching sleeves are primarily oriented parallel to the rotational direction of the drive shaft and are linearly displaceable in the hand-held tool housing. The positioning of the switching sleeves results in appropriate formlocking engagements in the area between a tooth gear and the drive shaft. Mostly, two separate switches are provided for drilling and chiseling operational modes for operating at most two separate switching sleeves. For safety reasons, when the hand-held tool has more than two operational mode, dependent on a possible sequence of the operational modes, rather expensive means needs to be provided to insure mutual blocking of separate switching or indexing positions.

A rotary switch for selecting one of several discrete switching or indexing positions, which is determined by a respective angular range, is manually rotated in a respective direction in accordance with a permissible switching sequence over the predetermined angular range. The switching is effected by converting the rotational movement of the rotary switch into other types of movement, e.g., the linear, movement in respective switching positions. The conversion is effected with, e.g, a switching member or special guide means.

German Publication DE 43 02 083A1 discloses a rotary switch for switching between different modes that includes an eccentrically arranged journal engaging in a groove of a linear displaceable switching sleeve.

It is known to provide, in the transitional region between different operational modes, resilient elements for switching between different operational modes. A discrete switching position is determined by a stable condition of a spring-biased elastic element. Thus, U.S. Pat. No. 5,379,848 discloses synchronization of switching by using a spring-biased tooth gear, with the rotary switch being switchable in any other position. The switching of a position is effected by a linear displacement of a switching sleeve into which a journal, which is eccentrically arranged in the rotary switch, engages.

In U.S. Pat. No. 5,992,257, the synchronization of a switching process is effected with a resilient element arranged between two movable parts of the rotary switch. One part is switched manually against a biasing force independent of an internal synchronization condition. The other part is subjected to action of a spring force generated during the internal switching process upon effecting the synchronization.

European Publication EP 0 437 716 discloses a rotary switch for a hand-held tool with three operational modes. The rotary switch includes a switching spring for effecting synchronization. An inadvertent further switching is reliably prevented with a push-button formlockingly engaging in the rotary switch.

An object of the present invention is to provide a single rotary switch for a hand-held power tool for selecting an operational mode of at least three operational modes of the hand-held power tool and with which the operational mode can be selected independent from the instantaneous position of the inner switching means.

Another object of the present invention is to provide a rotary switch for a hand-held tool with more than two operational modes which reliably prevents an inadvertent switching from an actual mode to an adjacent, in the switching sequence, mode of operation.

SUMMARY OF THE INVENTION

These and other objects of the present invention, which will become apparent hereinafter, are achieved by providing a rotary switch including a manually operated actuation member rotatable over a predetermined angle for switching from one operational mode to another immediately adjacent operational mode, a rotatable switching member for displacing a switching element of the hand-held power tool and arranged coaxially with the actuation member, an overhanging spring connected with the switching member for joint rotation therewith, and an operating pin connected with the actuation member and arranged eccentrically with respect to its rotational axis for deflecting an arm of the overhanging spring. Thereby the switching member is rotated over a predetermined angle and provides for a predetermined displacement of the switching element necessary for switching from the one operational mode to the other operational mode.

According to the present invention, the eccentrically arranged operating pin transmits a torque from the rotatable actuation member to an overhanging spring, which is preferably formed as a leaf spring and is fixedly connected with the rotatable switching member. The overhanging spring acts as a resilient coupling between the actuation member and the switching member, functioning as a torque-transmitting element of the actuation member and as a torque-receiving member of the switching member. The overhanging spring temporarily stores the torque until a formlockingly engagement of the switching member with the inner switching element in the hand-held power tool takes place.

The self-locking of the actuation member with respect to the hand-held tool housing is advantageously effected by an adequate static friction or by a retaining element, e.g., a spring-biased ball engageable in a recess formed in the actuation member.

Advantageously, the available spring excursion of the overhanging spring is limited by a stop connected with the switching member and limiting the deflection of a spring arm by the operating pin. The stop prevents an unpermissible overturning of the actuation member of the switch. Thereby, the overloading of the spring and the overrotation or overturning toward the next, in the switching sequence, position are reliably prevented. The overturning toward the next position is prevented as a result of the constraint caused the stop which prevents further deflection of the spring by the operating pin.

Advantageously, for each rotational direction of the rotary switch corresponding to a respective operational mode, there is provided an operating pin and/or an overhanging spring. Thereby, the rotary switch is protected from overrotation in both directions, and upon rotation of the rotary switch, only the operating pin and the overhanging spring, which are associated with the specific rotational direction of the rotary switch, cooperate.

Advantageously, there is provided a common spring with two independently deflectable arms, which cooperate with respective operating pins. The spring is advantageously secured, in its middle section, to the switching member for joint rotation therewith.

Advantageously, the point of attachment of the spring is located opposite the operating pin or pins, which provides for a larger spring excursion.

Advantageously, when there are provided several arms and/or operating pins, they occupy, with respect of a set position, when there are provided synchronized switching elements, mirror symmetrical positions. An operating pin can be so arranged that it contacts one or both sides of the overhanging arm of the spring.

A single overhanging arm advantageously is located on the periphery of the plane of symmetry and is biased by one or both operating pins transverse to the plane of the symmetry. With two overhanging arms, they are advantageously extend along chords symmetrically arranged relative to each other, and are biased transverse to the longitudinal extent inward and/or outward by one or two operating pins associated therewith, or by one common pin.

Advantageously, a single stop is associated with two overhanging arms and is located within the plane of symmetry, or the stop can be divided in two parts symmetrically arranged with respect to the plane of symmetry.

Advantageously, the switching member has an eccentrically arranged journal which engages in a preferably, linear moveable switching element, e.g., a moveable sleeve. A plurality of switching elements can advantageously be connected, at least partially, by switching transmission means, e.g, a switching plate. Advantageously, decoupling of two components of a rotational movement of the rotary switch is effected by displacement of the switching transmission means in two mutually perpendicular directions.

When there are provided three switching elements, a first switching element provides for turning a rotary drive of the tool spindle of the hand-held tool on and off, a second switching element provides for turning a percussion drive of the tool spindle of the hand-held tool on and off, and a third switching element provides for effecting one of blocking a rotational movement of the tool spindle relative to a hand-held tool housing and unblocking the rotational movement of the tool spindle relative to the housing.

At least three operation modes which are selected by a rotary switch upon its incomplete rotation within an angular range of 360°, are uniformly distributed in the operational range of the rotary switch in accordance with the switching sequence.

The rotary switch insures that more than two operational modes can be switched on or actuated only in a definite sequence. The rotary switch sets an angular region corresponding to respective operational mode and, with an eccentrically arranged member, formlockingly transforms the rotation over the set angular region into a linear movement of a first, axially displaceable switching element which is connected, by a switching transmission means, with a synchronizingly linearly displaceable, second switching element actuatable in another region. Thereby, a user can select, with a rotary switch, one or more than two operational modes of a combination hand-held tool.

The novel features of the present invention, which are considered as characteristic for the invention, are set forth in the appended claims. The invention itself, however, both as to is construction and its mode of operation, together with additional advantages and objects thereof, will be best understood from the following detailed description of the preferred embodiment when read with reference to the accompanying drawings.

DETAILED DESCRIPTION OF THE PREFERRED EMBODIMENTS

Figure 1:
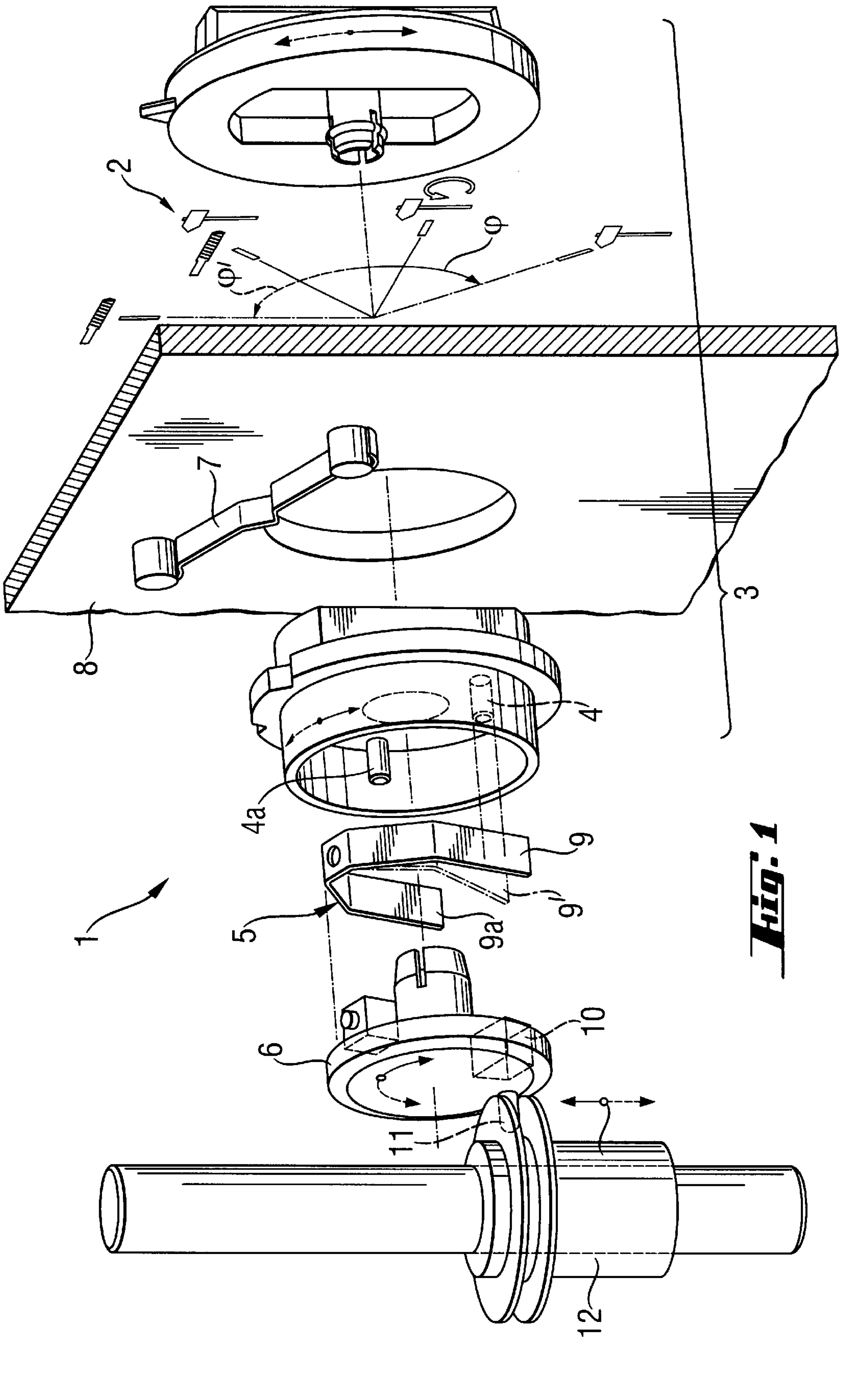
FIG. 1 an exploded view of a rotary switch according to the present invention for a hand-held power tool.

A rotary switch 1 according to the present invention, which is shown in FIG. 1, is designed for selecting an operational mode from four possible operational modes 2 of a hand-held power tool, e.g., for switching from an actual operational mode to another, immediately adjacent predetermined mode. To this end, the rotary switch 1 should be manually rotated by an angle $\phi$. The rotary switch includes a self-locking actuation member 3 formed of two formlockingly engaging each other components, and an eccentrically arranged operating pin 4 connectable with the actuation member 3. The rotary switch 1 further includes a rotatable switch member 6 and an overhanging spring 5, which is formed as a leaf spring and which is fixedly connected with the switch member 6. The spring 5 has one of its side being deformed upon contact with the operating pin 4, as shown with dot-dash lines in FIG. 1. For self-locking the actuation member 3, there is provided a retaining member 7 formed as a leaf spring. The retaining member 7 engages in a recess of an entraining member of the actuation member 3. The available spring excursion of an arm 9 of the spring 5 is limited by a stop 10 connected with the switch member 6, and is shown at $9^1$.

For selecting a further operational mode, which can be effected by rotating the actuation member 3 by an angle $\phi^1$ in a direction opposite to the direction of rotation by angle $\phi$, there is provided a second operational pin 4*a* that cooperates with an arm 9*a* of the spring 5. The spring 5 is secured to the switch member 6 at its middle section. The arms 9, 9*a* and the operating pins 4, 4*a* are arranged mirror-symmetrically with respect to each other, with the arms 9, 9*a* being arranged along chords located symmetrically toward each other. Upon switching, only one arm, e.g., the arm 9 is deflected inward, transverse to its longitudinal extent, by the associated operating pin 4 upon the actuation member 3 being rotated by angle $\phi$. The stop 10 limits the deflection of both arms 9, 9*a* upon rotation of the actuation member 3 by the angle $\phi$, $\phi^1$, respectively. The braking member 6 has an eccentrically arranged, axially extending journal 11 extending into linearly displaceable switch element 12 which is formed as a switching sleeve.

Figure 2:
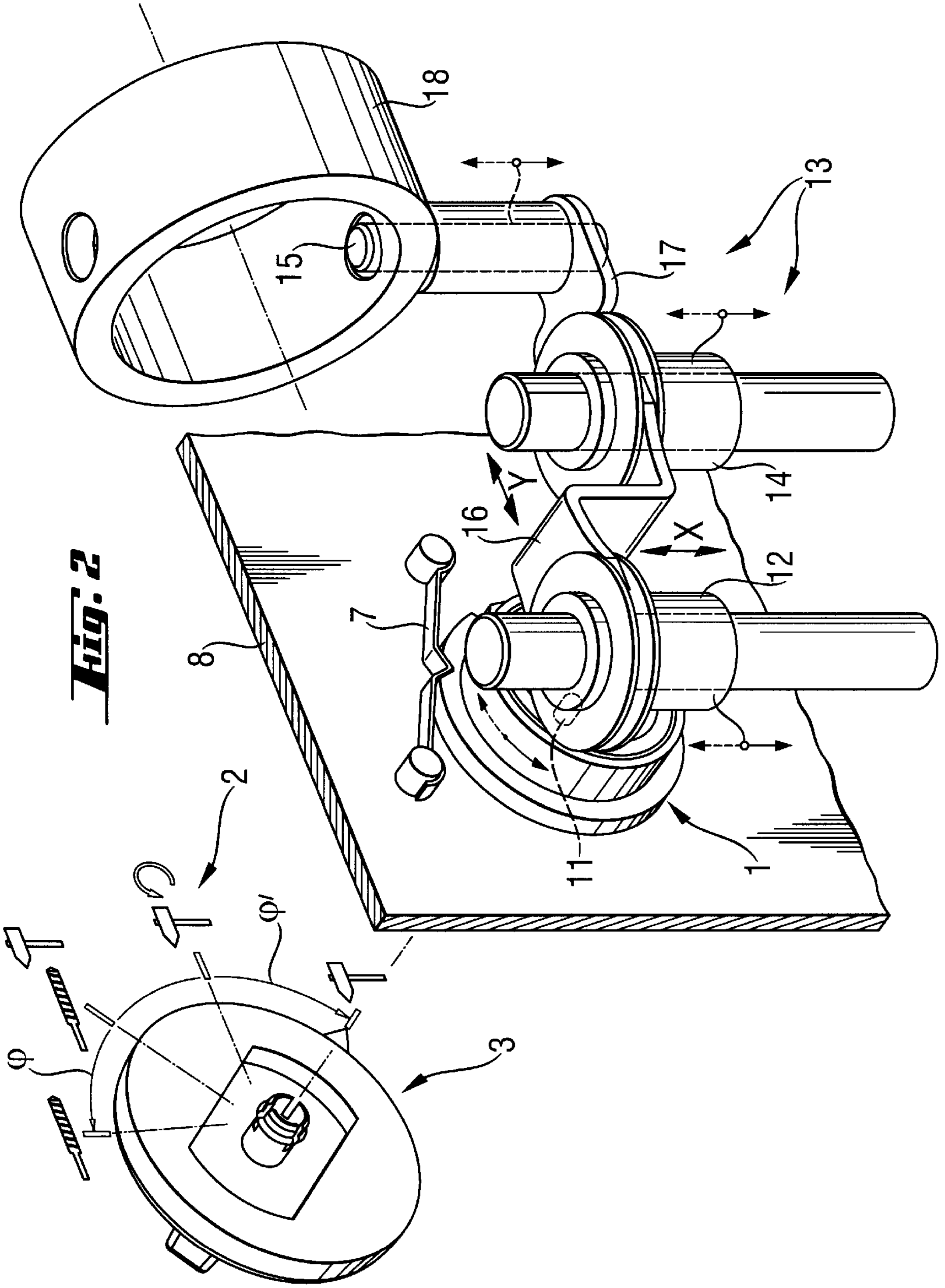
FIG. 2 an exploded view of a switching device according to the present invention for a hand-held power tool.

FIG. 2 shows a switching arrangement 13 of switching elements 12, 14, and 15 within a combination hand-held tool.. The switching elements 12, 14, 15 include two switching sleeves 12, 14 and a catch bolt 15. The switching elements 12, 14 and 15 are partially connected with each other by selection transmitting means 16, 17 in form of transmitting plates. Decoupling of two components x, y of the rotational movement of the rotary switch 1 is defined by two mutually perpendicular displacement directions of the selection transmitting means 16, 17. The rotational movement of the rotary switch 1 is converted into movement of the selection transmitting means 16, 17 with the axially extending journal 11 that, as discussed above, engages the linearly displaceable switch element 12. The switching element 12 changes, with respect to a tool spindle 18, the operation of the rotary drive, the switching element 14 changes the operation of the percussion drive, and the switching element 15 blocks the rotational movement of the tool spindle 18 with respect to the housing 8 of the power tool. Due to the arrangement 13, it is possible to select any of four operational modes 2 upon incomplete rotation of the rotary switch 1 within the angular range of 360°, with the four operational modes being uniformly distributed within the operational range of the rotary switch 1 in accordance with the switching sequence.

Below is a switching table for the four operational modes with their switching sequences:

| Switching Sequence | Designation | Rotary Drive | Percussion Drive | Blocking |
|---|---|---|---|---|
| 1 | Drilling | ON | OFF | OFF |
| 2 | Drilling and chiseling | ON | OFF | OFF |
| 3 | Chisel positioning | OFF | ON | OFF |
| 4 | Chiseling | OFF | ON | ON |

Though the present invention was shown and described with references to the preferred embodiment, such are merely illustrative of the present invention and are not to be construed as a limitation thereof, and various modifications of the present invention will be apparent to those skilled in the art. It is, therefore, not intended that the present invention be limited to the disclosed embodiments or details thereof, and the present invention includes all variations and/or alternative embodiment within the spirit and scope of the present invention as defined by the appended claims.

What is claimed is:

1. A rotary switch for a hand-held power tool having a plurality of different operational modes, the rotary switch comprising manually operated actuation member (3) rotatable over a predetermined angle (ϕ) for switching from one operational mode to another immediately adjacent operational mode; a rotatable switching member (6) for a displacing a switching element (12) of the hand-held power tool and arranged coaxially with the actuation member (3); an overhanging spring (5) connected with the switching member (6) for joint rotation therewith; and an operating pin (4) connected with the actuation member (3) and arranged eccentrically with respect to a rotational axis thereof for deflecting an arm (9) of the overhanging spring (5) to thereby rotate the switching member (6) over a predetermined angle to provide for a predetermined displacement of the switching element (12) necessary for switching from the one operational mode to the other operational mode.

2. A rotary switch according to claim 1, further comprising a retaining member (7) providing for self-locking of the actuation member (3).

3. A rotary switch according to claim 1, further comprising a stop (10) connected with the switching member (6) for limiting an available excursion of the deflectable arm (9) of the overhanging spring (5).

4. A rotary switch according 50 claim 1, further comprising a further operating pin **(4*a*) for deflecting another arm (9*a*) of the overhanging spring (5) upon rotation of the actuation member (3) over an angle ($\phi^1$) in a direction opposite to a direction in which the actuation member (3)** is rotated over the angle (ϕ) for switching from the one operational mode to a further operational mode.

5. A rotary switch according to claim 4, wherein the one arm (9) and the another arm **(9*a*) of the overhanging spring (5)** are deflectable independently of each other.

6. A rotary switch according to claim 5, wherein the spring (5) is secured to the switching member (6) for joint rotation therewith in a middle section thereof opposite the operating pins **(4, 4*a*)**.

7. A rotary switch according to claim 1, further comprising an axially extending journal (11) connected with the switching member (6) and rotatably formlockingly engageable in the switching element (12) for effecting a linear displacement thereof upon rotation of the switching member (6).

8. A switching device for a handheld tool having a plurality of different operational modes, comprising a rotary switch including a manually operated actuation member (3) rotatable over a predetermined angle (4) for switching from one operational mode to another immediately adjacent operational mode, a rotatable switching member (6) for displacing a switching element (12) of the hand-held power tool and arranged coaxially with the actuation member (3), an overhanging spring (5) connected with the switching member (6) for joint rotation therewith, and an operating pin (4) connected with the actuation member (3) and arranged eccentrically with respect to a rotational axis thereof for deflecting an arm (9) of the overhanging spring (5) to thereby rotate the switching member (6); and switching means (13) arrangeable within the hand-held power tool and including a plurality of switching elements (12, 14, 15) actuatable in response to rotation of the switching member (6), and selection transmission means (16, 17) for at least partially connecting the switching elements (12, 14, 15) with each other.

9. A switching device according to claim 8, wherein decoupling of two components (x,y) of a rotational movement of the rotary switch is effected by displacement of the switching transmission means (16, 17) in two mutually perpendicular directions.

10. A switching device according to claim 9, wherein a first switching element (12) provides for turning of a rotary drive of a tool spindle (18) of the hand-held tool on and off, a second switching element (14) provides for turning of a percussion drive of the tool spindle (18) of the hand-held tool on and off, and a third switching element (15) provides for effecting one of blocking a rotational movement of the tool spindle (18) relative to a hand-held tool housing (8) and unblocking the rotational movement of the tool spindle (18) relative to the housing.

* * * * *